(12) United States Patent
Heedt et al.

(10) Patent No.: US 10,714,568 B2
(45) Date of Patent: Jul. 14, 2020

(54) METHOD FOR PRODUCING A FLAT FREE CONTACTING SURFACE FOR SEMICONDUCTOR NANOSTRUCTURES

(71) Applicant: Forschungszentrum Juelich GmbH, Juelich (DE)

(72) Inventors: Sebastian Heedt, Wuerselen (DE); Julian Gerharz, Leipzig (DE); Thomas Schaepers, Aachen (DE); Detlev Gruetzmacher, Niederzier (DE)

(73) Assignee: FORSCHUNGZENTRUM JUELICH GMBH, Juelich (DE)

( * ) Notice: Subject to any disclaimer, the term of this patent is extended or adjusted under 35 U.S.C. 154(b) by 0 days.

(21) Appl. No.: 15/779,856

(22) PCT Filed: Oct. 22, 2016

(86) PCT No.: PCT/DE2016/000379
§ 371 (c)(1),
(2) Date: May 30, 2018

(87) PCT Pub. No.: WO2017/092723
PCT Pub. Date: Jun. 8, 2017

(65) Prior Publication Data
US 2018/0366543 A1    Dec. 20, 2018

(30) Foreign Application Priority Data

Dec. 2, 2015    (DE) .................. 10 2015 015 452

(51) Int. Cl.
*H01L 29/06* (2006.01)
*B82Y 10/00* (2011.01)
(Continued)

(52) U.S. Cl.
CPC .......... *H01L 29/0673* (2013.01); *B82Y 10/00* (2013.01); *B82Y 40/00* (2013.01);
(Continued)

(58) Field of Classification Search
None
See application file for complete search history.

(56) References Cited

U.S. PATENT DOCUMENTS

| | | | | |
|---|---|---|---|---|
| 6,383,923 B1 * | 5/2002 | Brown | .............. | H01L 21/76885 438/666 |
| 2003/0219992 A1 * | 11/2003 | Schaper | .................. | B29C 33/52 438/748 |

(Continued)

FOREIGN PATENT DOCUMENTS

| | | |
|---|---|---|
| WO | WO 2009032413 A1 | 3/2009 |
| WO | WO 2015157219 A1 | 10/2015 |

OTHER PUBLICATIONS

Chih-Chieh Hsu, et al., "Fabrication for Cu/Hydrogen Silsesquioxane Damascene Structure by Nanoimprint", Journal of The Electrochemical Society, vol. 157, No. 4, Dec. 2010, H443-H448.

(Continued)

*Primary Examiner* — Andres Munoz
(74) *Attorney, Agent, or Firm* — Leydig, Voit & Mayer, Ltd.

(57) ABSTRACT

A method for producing a planar free surface comprising embedded, contactable nanostructures includes arranging at least one nanostructure on a surface of an initial substrate; applying a first layer to the surface of the initial substrate, wherein the first layer embeds the at least one nanostructure; applying a target substrate to the first layer; and separating the initial substrate from the first layer such that the at least one nanostructure embedded in the first layer has a planar free surface. An additional layer is applied to the surface of the initial substrate before the at least one nanostructure is applied to the initial substrate, and in that the initial substrate is removed from the first layer using a solvent.

18 Claims, 8 Drawing Sheets

(51) Int. Cl.
*B82Y 40/00* (2011.01)
*H01L 29/66* (2006.01)
*H01L 29/775* (2006.01)
*H01L 29/40* (2006.01)

(52) U.S. Cl.
CPC ...... *H01L 29/401* (2013.01); *H01L 29/66469* (2013.01); *H01L 29/775* (2013.01)

(56) References Cited

U.S. PATENT DOCUMENTS

| | | | |
|---|---|---|---|
| 2008/0134961 A1* | 6/2008 | Bao | B82Y 10/00 117/86 |
| 2009/0066352 A1* | 3/2009 | Gritters | B82Y 10/00 324/755.05 |
| 2009/0098393 A1* | 4/2009 | Anderson | C08J 5/18 428/447 |
| 2009/0137091 A1 | 5/2009 | Lee | |
| 2010/0052112 A1 | 3/2010 | Rogers et al. | |
| 2011/0018424 A1* | 1/2011 | Takada | H01L 31/02246 313/352 |
| 2011/0121434 A1 | 5/2011 | Li et al. | |
| 2011/0133284 A1* | 6/2011 | Mitra | B08B 7/0035 257/368 |
| 2011/0159209 A1* | 6/2011 | Kawamura | B82Y 10/00 427/557 |
| 2011/0256451 A1* | 10/2011 | Cui | B32B 5/26 429/218.1 |
| 2011/0281070 A1* | 11/2011 | Mittal | H01L 31/02246 428/142 |
| 2012/0021164 A1* | 1/2012 | Sansom | B29C 70/64 428/95 |
| 2012/0098419 A1 | 4/2012 | Chiba et al. | |
| 2012/0168710 A1 | 7/2012 | Wang et al. | |
| 2014/0021492 A1 | 1/2014 | Wolk et al. | |
| 2015/0179877 A1* | 6/2015 | Hu | H01L 33/06 257/13 |
| 2015/0207107 A1 | 7/2015 | Schwartz et al. | |

OTHER PUBLICATIONS

Zhixin Cui, et al., "Characterizing the electron transport properties of a single (110) InAs nanowire", Applied Physics Express, vol. 7, Jul. 18, 2014, pp. 085001-1-085001-4.

Henry J H Chen, et al., "Fabrication of Au nanowires on hydrogen silsesquioxane by nanoimprint transfer", Institute of Physics Publishing, Nanotechnology, vol. 16, Oct. 25, 2005, pp. 2913-2918.

Jinwook W. Chung, et al., "N-Face GaN/AlGaN HEMTs Fabricated Through Layer Transfer Technology", IEEE Electron Device Letters, vol. 30, No. 2, Feb. 2009, pp. 113-116.

Mariano A. Zimmler, et al., Scalable Fabrication of Nanowire Photonic and Electronic Circuits Using Spin-on Glass, Nano Letters, vol. 8, No. 6, Dec. 2018, pp. 1695-1699.

Yun Sheng, et al., "Fabrication of lateral electrodes on semiconductor nanowires through structurally matched insulation for functional optoelectronics", IOP Publishing, Nanotechnology, vol. 24, Dec. 13, 2012, pp. 1-7.

S. Heedt, et al., "Electrical Spin Injection into InN Semiconductor Nanowires", Nano Letters, vol. 12, Aug. 13, 2012, pp. 4437-4443.

Kilian Flöhr, et al., "Manipulating InAs nanowires with submicrometer precision", Review of Scientific Instruments, vol. 82, Dec. 2011, pp. 113705-1-113705-3.

David K. Ferry, "Nanowires in Nanoelectronics", Materials Science, vol. 319, Feb. 1, 2008, pp. 579-580.

Jinwook W. Chung, et al., "Seamless On-Wafer Integration of Si(100) MOSFETs and GaN HEMTs", IEEE Electron Device Letters, vol. 30, No. 10, Oct. 2009, pp. 1015-1017.

* cited by examiner

US 10,714,568 B2

METHOD FOR PRODUCING A FLAT FREE CONTACTING SURFACE FOR SEMICONDUCTOR NANOSTRUCTURES

CROSS REFERENCE TO RELATED APPLICATIONS

This application is a U.S. National Stage Application under 35 U.S.C. § 371 of International Application No. PCT/DE2016/000379 filed on Oct. 22, 2016, and claims benefit to German Patent Application No. DE 10 2015 015 452.2 filed on Dec. 2, 2015. The International Application was published in German on Jun. 8, 2017 as WO 2017/092723 A1 under PCT Article 21(2).

FIELD

The invention relates to a new method for planarizing nanostructures, in particular nanowires, for example prior to electrical contacting. The invention further relates to a method for vertical lamination of a plurality of nanostructures, i.e. for producing one or more layers comprising embedded nanowires or nanowire networks or other nanostructures that can be electrically contacted.

BACKGROUND

Self-assembled nanostructures, in particular semiconductor nanowires, which have been researched intensively for a few years, could soon be used as elementary components in computer chips. This is due to the significantly superior electron mobility in group III/V semiconductor nanowires compared with the conventional silicon CMOS technology. Moreover, there is the possibility of optoelectronic functionality, as well as the use of new, electrically controllable magnetic functionality in the field of spintronics, as well as the use, sought after by many working groups, of nanowires in the field of quantum computing. Applications in the field of spintronics are of particular importance, since group III/V semiconductor nanowires in addition often make it possible to also control the spin, i.e. the intrinsic angular momentum, of the electrons in a transistor, in addition to the electronic property of the charge.

In the field of spintronics, making use of nanowires leads to particular challenges, since electrical contacting using magnetizable electrodes requires the nanostructures to be planarized in advance (FIG. 1).

Thin metal layers, which have been used hitherto for electrically contacting the nanowires, may be interrupted due to the geometry (by shadowing effects during the directed deposition) (FIG. 1a). In ferromagnetic materials, which are used for electrically injecting spin-polarized currents, undesired and inhomogeneous alignment of the local magnetization may occur (FIG. 1b). Domain formation of this kind renders the component unusable for applications in the field of spintronics.

Spin-on oxide (e.g. hydrogen silsesquioxane by Dow Corning®), also referred to in the following as HSQ, has already been used multiple times in literature for planarizing nanowires (FIG. 2). After being spun on, the HSQ layer was removed again by means of reactive ion etching until the upper face of the nanowire was again exposed [1-3].

The method mentioned above has the advantage that individual nanowires can be planarized by means of embedding in an oxide layer (FIG. 2). However, the etching time must be precisely adjusted for each nanowire, depending on the diameter of the nanowire and the local oxide layer thickness, and must be laboriously monitored, by means of scanning force microscopy, between a plurality of etching steps of the etching progress. As a result, in a sample, only nanostructures/nanowires having an identical diameter can be optimally planarized at the same time. In addition, the reactive ion etching/plasma etching may, in some circumstances, negatively influence the nanostructures/nanowires (in particular the surface properties thereof).

Moreover, there are significant process-related difficulties with regard to the vertical integration of horizontal nanowires or of nanowire networks in application. CMP (chemical mechanical planarization) is a central aspect of computer chip production and is of decisive importance for the vertical integration, which is conventional in modern computer chips, since a plurality of layers of conductor tracks, transistors or logic components are always arranged on top of one another with a degree of precision in nanometers. Since CMP cannot be used for nanowires and other nanostructures or affects the structural integrity thereof, an iterable method is required which can apply a plurality of nanowire layers on top of one another without CMP or etching steps, which layers can be connected by vertical feedthroughs (known as vias-vertical interconnect access) (FIG. 11).

HSQ has already been used for layer transfer [4, 5]. The method implements HSQ in order to connect two wafers by means of wafer bonding. In this case, the HSQ does not serve to transfer or planarize nanostructures, but instead merely allows a connection between a silicon wafer and a GaN layer. Moreover, the initial substrate is not removed by dissolving a contact layer (e.g. of PMMA) in a solvent, but instead the entire transfer wafer (i.e. the initial substrate) is removed by means of reactive ion etching.

Sheng et al. [6] have proposed a method for transferring nanowires. The aim in this case is to conduct an electrical current laterally, instead of axially, through the ZnO nanowires. For this purpose, the nanowire is aluminized, and the transfer wafer comprising the aluminum layer is adhesively bonded to another Si wafer using an adhesive. Since the bond between aluminum and silicon is only weak, the adhesively bonded wafer comprising the aluminum layer and the nanowires embedded therein can be removed by means of mechanical shearing forces. The nanowires are in the aluminum layer, and said layer is planar on the surface since it originally formed the junction with the silicon. This method, too, results in planarization of nanowires. Here, however, the nanowire is embedded in a metal electrode. This electrically short-circuits the nanowire along the growth axis thereof, and thus does not allow for an application within the meaning of the present invention.

In particular, vertical integration of planar, integrated circuits consisting of nanostructures/nanowires is not possible in the method mentioned above.

SUMMARY

In an embodiment, the present invention provides a method for producing a planar free surface comprising embedded, contactable nanostructures. The method includes arranging at least one nanostructure on a surface of an initial substrate; applying a first layer to the surface of the initial substrate, wherein the first layer embeds the at least one nanostructure; applying a target substrate to the first layer; and separating the initial substrate from the first layer such that the at least one nanostructure embedded in the first layer has a planar free surface. An additional layer is applied to the surface of the initial substrate before the at least one nanostructure is applied to the initial substrate, and in that the initial substrate is removed from the first layer using a solvent.

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following.

DETAILED DESCRIPTION

Embodiments of the invention provide methods for planarizing nanostructures, in particular nanowires, which overcome certain disadvantages of the prior art, and in particular, improve electronic functionality within the layer.

Embodiments of the invention further provide methods for embedding nanostructures in layers, which methods can be iteratively repeated and allow connections to be made between the embedded nanostructures, in different layers, in a simple manner.

Embodiments of the invention provide methods for planarizing nanostructures, in particular nanowires. Such methods can advantageously be used as a specification for electrical contacting of nanostructures, and in addition allows vertical integration of nanostructures, in particular of nanowires or nanowire networks.

In this case, for example an individual nanowire or also a network of connected nanowires can be understood to be a nanostructure.

Suitable nanostructures comprise, for example, InN, InAs, InSb, Si, Ge or Au. Moreover, SiGe, InP, GeSn, GaAs, carbon nanotubes (CNTs), fullerenes (e.g. $C_{60}$), graphene flakes, graphene nanoribbons, $MoS_2$, Al, Ag, ZnO, CdS, CdSe, $Bi_2Te_3$, $Bi_2Se_3$, $Sb_2Te_3$ or HgTe would also be suitable as materials for a nanostructure. In particular, mixtures of the above-mentioned compounds are also conceivable. In general, single-element semiconductors of the fourth main chemical group, compound semiconductors of the third and fifth or the second and sixth main chemical groups, and metals, are suitable as materials for the nanostructures.

Within the context of this invention, the term "planarizing" or "planarization" can be understood as both the production of a planarized surface that allows electrical contacting with, for example, titanium/gold or ferromagnets, and also the alignment of nanostructures of different sizes on one plane. The possibility of vertical lamination is, inter alia, a central aspect of the invention.

According to embodiments of the invention and unlike in the case of Sheng et al. [6], nanostructures are not applied directly to a transfer substrate (initial substrate) which has to be mechanically separated from the nanostructure at a later point in time.

According to embodiments of the invention, the nanostructures are therefore not arranged directly on a transfer substrate, for example a Si wafer, but instead on a resist layer that dissolves easily in a solvent and is previously applied to the transfer substrate.

Figure 3:
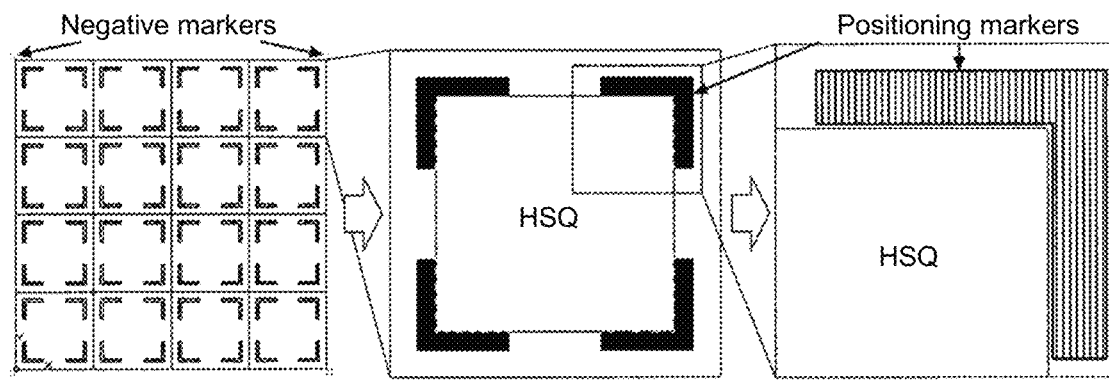
FIG. 3 shows an example layout for a conventional initial substrate.

For this purpose, in an advantageous embodiment of the invention, position markers (dispersion markers) that are first defined by means of electron-beam lithography and subsequently etched into the initial substrate may be created in the substrate in order to later position the nanowires/nanostructures. Dispersion markers of this kind, e.g. formed as negative markers, are shown in FIG. 3.

Suitable initial substrates are, for example, substrates comprising Si, GaAs, InP, Ge, InAs, InGaAs, AlGaAs, GaN, and also quartz, sapphire, diamond or metals. In general, Si and other single-element semiconductors of the fourth main chemical group, and compound semiconductors of the third and fifth or the second and sixth main chemical groups are suitable as substrates. The substrate surfaces should expediently be planar and should be subjected to conventional cleaning steps of clean-room technology prior to use. In particular, the surfaces may also comprise oxide or nitride layers or may be combined with boron nitride and/or graphene layers.

In a method according to an embodiment of the invention, a resist layer that can be removed or dissolved by a solvent is first applied, in a planar manner, to the previously cleaned surface on an initial substrate (transfer substrate). A resist layer suitable for this purpose may in particular consist of polymethyl methacrylate (PMMA) or a polymer of methyl methacrylate and methacrylic acid (PMMA/MA copolymer), or may consist for example of optical photoresists, such as AZ 5214 E, AZ P4620, AZ 4562, AZ nLOF 20xx or the like. The necessary layer thickness of the resist layer may be a few nanometers, but can also be in the range of a few micrometers. Advantageous resist layer thicknesses are between 50 and 200 nm.

In this case, the resist layer may be applied by means of known methods, such as spinning-on, sprinkling or spreading.

In a preferred embodiment of the invention, the applied resist is first baked, together with the transfer substrate, in order to allow degassing from the resist layer of any solvent that may be present, such as ethyl lactate. For example, for this purpose the temperature may be increased to approximately 180° C. The time for the degassing is generally between 5 and 30 minutes, depending on the layer thickness of the resist layer, but is generally not critical. Temperatures of significantly above 200° C. may disadvantageously cause the resist to harden. For example, in the case of a resist layer thickness of 120 nm, degassing for 10 minutes at a maximum temperature of 180° C. is entirely sufficient.

In a further advantageous embodiment of the invention, the resist may also be applied in a plurality of steps, i.e. in a plurality of layers, which layers may optionally also comprise different types of resist. In this case, baking in order to degas any solvent that may be present is typically carried out after every individual layer that is applied.

Optionally, but not essentially, it is in addition also possible for an additional adhesion promoter layer to be applied to the resist after the resist layer(s) has/have been degassed and before or after the nanostructures have been applied. A suitable adhesion promoter layer of this kind may for example comprise hexamethyldisilazane (HMDS).

The adhesion promoter layer can optionally also be dissolved or etched by a solvent during the subsequent treatment. However, this is not essential.

In general, an applied adhesion promoter layer has only a very low layer thickness, and is in particular advantageously formed as a monolayer on the resist layer. In this case, the optional adhesion promoter layer may be applied by means of known methods, such as chemical vapor deposition of HMDS.

In the next method step, the nanostructures are then applied to the resist and/or adhesion promoter layer. This can be carried out in conventional manners, as known from literature. This includes, for example, mechanical transfer using a clean room cloth or by means of a method in which the wafer comprising the (PMMA) resist layer, as the initial substrate, is first brought into contact with a growth substrate on which the nanostructures are epitaxially created, or also application of the nanostructures to the initial substrate using a solvent, such as isopropanol, the solvent subsequently being vaporized. Deliberate transfer using micromanipulators, or similar methods, are also conceivable [7].

In a further method step, in order to embed the nanostructures/nanowires, a spin-on glass (SOG) or a flowable oxide is applied to the resist or adhesion promoter layer comprising the arranged nanostructures in such a way that the nanostructures are embedded into the carrier matrix completely or in part. For this purpose, for example HSQ resists or the like can be used. Further flowable dielectrics, for example nitrides, in addition to oxides, would also be conceivable and suitable as a carrier matrix for embedding the nanostructures.

HSQ (hydrogen silsesquioxane) is to be understood as inorganic compounds which, although having similar properties to quartz ($SiO_2$), contain a large amount of hydrogen ($H_8Si_8O_{12}$ inter alia) and are dissolved in a solvent. HSQ resists are generally baked at approximately 90° C. in order to evaporate solvent.

In an advantageous embodiment of the invention, the HSQ resist XR-1541 by Dow Corning® is used. In this case, the HSQ is dissolved in the solvent methyl isobutyl ketone (MIBK). Alternatively, the carrier matrix can, by way of example, be created from similar resists, such as the HSQ resists FOx® 1× and 2× by Dow Corning®, or other flowable oxides. HSQ resists are distinguished, as electron beam-sensitive negative resists for electron-beam lithography, by optical transparency and a high resolution of approximately 6 nm. If this property is not required in following optional steps, other variants, for example using polymers that function as spin-on glass, are also appropriate. Said glass comprises, by way of example, polymethylsiloxane of the trademark Honeywell ACCUGLASS®, or silicate-based spin-on glass which can also be used to planarize nanostructures.

In this case, the carrier matrix can be applied in one step or in a plurality of steps. The typical layer thickness of an applied resist layer is approximately 180 nm for HSQ resist XR-1541 for example, but can also be reduced to approximately 30 nm by means of dilution in MIBK. Using multilayers or other comparable resists such as FOx® 1× and 2×, allows layer thicknesses in the range of micrometers to advantageously be achieved.

In this case, the required layer thickness of the carrier matrix to be applied depends, inter alia, on the cross section of the nanostructures used. If the thickness of the nanostructures requires this, spinning on and baking of the resists can be iteratively repeated until the nanostructure is optimally enclosed by the HSQ or SOG.

In an advantageous embodiment of a method according to the invention, preliminary structuring may take place prior to the wafer bonding, during which structuring for example tile-like structures are inscribed into the HSQ layer by means of electron-beam lithography or EUV lithography (see FIG. 3). For example MF® CD-26, MFC-24A, AZ 326MIF or AZ 400K are suitable as developers, which do not corrode or develop the resist layer below the nanostructures. In particular, this aspect can make use of the fact that the resist layer below the nanostructures is formed as a positive resist for electron-beam lithography (such as PMMA), and the carrier matrix is formed as a negative resist for electron-beam lithography (such as HSQ). The structured HSQ layer can advantageously reduce the surface area in contact with the PMMA, which facilitates the subsequent removal, since the solvent can better corrode the PMMA. Moreover, said structures advantageously also allow for improved escape of hydrogen and any solvent residues between the wafers during the subsequent wafer bonding. Likewise, feedthroughs, known as vias, can also be lithographically defined prior to the wafer bonding.

In an advantageous embodiment of a method according to the invention, after the HSQ layer has been developed, the regions of the underlying (organic) resist layer then exposed can be removed using an oxygen plasma. Similarly to the case of the structuring of the HSQ layer described above, this can make it possible for the solvent to more easily penetrate between the two wafers in order to dissolve the resist layer.

The escape of possible gaseous reaction products during the wafer bonding is also facilitated.

The HSQ layer, as the transfer layer comprising the embedded nanostructures, is subsequently connected to a second substrate (target substrate) by means of wafer bonding or nanoimprint lithography. In the process, the two substrates are pressed together and baked at temperatures of over 200° C. In the Nanonex NX-2000 air pressure nanoimprinter used, the substrates were pressed together at an overpressure of approximately 1.38 MPa for approximately 10 minutes.

Various embodiments are possible for allowing the carrier matrix to be connected to the second substrate. For example, in addition to direct bonding, adhesive bonding or anodic bonding can also be used. "Rapid Thermal Processing" (RTP) can also be a simple alternative to wafer bonding, in which process the two substrates are placed or pressed together and baked in an RTP oven. In the process, the two substrates are connected, e.g. by means of a previously applied HSQ layer which is stoichiometrically converted in the process.

In an optional embodiment of a method according to the invention, the target substrate is also coated with a thin HSQ layer and baked for a few minutes at 90° C. before the two wafers are pressed together.

After the wafer bonding, the quality of the HSQ layer between the two wafers can be improved even more by means of Rapid Thermal Processing (RTP) in an RTP oven in order to complete the chemical conversion of the HSQ layer. It is important that the soluble (PMMA) resist layer does not harden in the process. However, for many applications, complete conversion of the HSQ layer is not advantageous, since, without this step, the HSQ or SOG can ensure that there is as little electrical capacitance as possible between the layers of a multilayer structure.

The resist layer or adhesion promoter layer located below the layer comprising the embedded nanostructures can subsequently advantageously be removed or dissolved easily under the action of a suitable solvent, for example acetone. The nanostructures or nanowires previously arranged precisely at the junction between the resist or adhesion promoter and the carrier matrix therefore necessarily lie (in a planar manner) directly on the new surface of the second substrate.

The HSQ resist, which is in fact soluble in a solvent, is modified by the method steps that precede the removal, such as the electron-beam lithography or EUV lithography and/or heat treatment, e.g. in an RTP oven, such that said resist can no longer be etched or dissolved by a solvent during the removal process.

The two interconnected substrates comprising the resist layer located therebetween can optionally be treated in an isotropic oxygen plasma before the resist layer is dissolved. Said etching of the layer can facilitate the dissolution of the resist layer in a solvent.

According to embodiments of the invention, the resist layer can advantageously be dissolved using a suitable solvent, and the substrate can thus be removed carefully from the previously arranged nanostructures without the HSQ matrix being corroded in the process. In this case, carefully means in particular without mechanical action and without too high a temperature load. Acetone and acetone-containing solvents, for example, as well as cyclopentanone and dimethyl sulfoxide (DMSO) or mixtures thereof are possible as suitable solvents for removing or dissolving the resist layer. This careful removal makes it possible to ensure that the nanostructures/nanowires—in particular the surface properties thereof—are not negatively influenced. According to the method, the nanostructures are on the planar surface of the HSQ layer which previously formed the junction with the resist layer. Since the surface of the HSQ layer is planar, the nanostructures arranged thereon, irrespective of the size or cross section thereof, are automatically also oriented in a planar manner on this plane.

Using this method according to an embodiment of the invention, nanostructures in particular also of different thicknesses and/or geometries can be arranged in a planar manner on the surface of the transfer layer that embeds the nanostructures, which surface is formed after the resist has been removed.

A further advantage when using a resist as an intermediate layer is that, in a particular embodiment of the method, the nanostructures can also be arranged so as to be embedded in the resist in part. This can be achieved by applying the nanostructures and heating again, during which process the nanostructures then sink into the resist in part (see FIG. 6). This may optionally also be achieved by means of mechanical pressure. When the resist layer is later dissolved, the nanostructures are then not flush with the surface, but instead protrude beyond said surface at least in part. An arrangement of this kind can be advantageous in particular when electrical contacting or metallization of circular nanowires requires a sufficient contact surface area (see FIG. 2). Although it is not possible in this case to refer to planarization in the strict sense of the term, this specific embodiment is still intended to be covered by the invention.

A method for planarizing according to an embodiment of the invention in particular also works for nanostructures of a different size and/or geometry. Unlike in the known methods [1, 2], in which the etching progress has to be laboriously checked, removing the substrate using a solvent is entirely uncritical since, apart from the resist layer or optionally the adhesion promoter layer to be dissolved, none of the remaining materials, i.e. neither the substrates nor the nanostructures or the HSQ or glass layer, are corroded by the solvent. In addition, the nanowires are not electrically short-circuited in the non-conductive carrier matrix [6].

A method according to an embodiment of the invention makes planarization/lamination of nanostructures possible in a simple manner, and allows subsequent facilitated electrical contacting.

The steps of a planarization method according to an embodiment of the invention can advantageously also be iteratively repeated in order to achieve vertical integration of the nanostructures or nanowires. Multilayer structures can thus be constructed layer-by-layer from horizontal nanowire networks.

A method according to an embodiment of the invention furthermore has the advantage that the transfer substrate used is not removed or destroyed, but instead is present entirely undamaged after removal using a solvent, and is available for further planarization or for further iterations during the vertical integration of a plurality of nanostructure or nanowire layers.

A method according to an embodiment of the invention is thus suitable in particular for producing nanowire components for nanowire-based logic, in particular new, reconfigurable logic [8].

In order to produce nanowire components for electrically injecting spin-polarized currents, ferromagnetic metal contacts, for example made of Co, Ni or permalloy, must be deposited onto a flat surface e.g. by means of molecular beam epitaxy. The plane must be as planar as possible, because otherwise the magnetization of the ferromagnets is prevented from being able to be toggled between two discrete alignments by applying an external magnetic field (see FIG. 1b).

In addition, it is frequently physically necessary for an oxide layer of approximately one nanometer in thickness to be applied as a tunnel barrier at the junction between the nanowire and the ferromagnet. Said layer must be continuous and be of an overall homogenous thickness.

In addition to the applications in the field of spintronics, methods according to embodiments of the invention can also be used in the field of conventional micro- and nanoelectronics. In this case, the focus is for example on the vertical integration of semiconductor nanostructures in computer chip processing (see FIG. 11). The method according to the invention can be easily upscaled and can be transferred to larger substrates.

Moreover, methods according to embodiments of the invention make it possible for dielectrics of a very small thickness to be applied to nanostructures, even using directed deposition methods, and this makes it possible to control field effect transistors in a particularly efficient manner.

The possibility of being able to convert HSQ into the oxide matrix only selectively, using electron-beam lithography and development, means that the transfer also generates free-floating nanostructures which are in contact with the substrate only at the ends. This can be of great significance for use in gas sensors, as the entire nanowire surface can thus come into contact with the gas to be detected.

Components in the field of water splitting would likewise benefit from the entire wire surface that is available for chemical reactions, and would at the same time allow electrical contacting at the ends of the wire.

For use in chemical sensors, nanowires that are exposed only in part or nanostructures that are free on just one side may also be of significance.

If the nanowires or even networks of crossed nanowires undergo wet-chemical selective dissolution for example, following a method according to an embodiment of the invention, the resulting channels may play a role in the field of micro- and nanofluidics. These may, for example, be applications for one-dimensional electrophoresis or blood analysis. Furthermore, nanoscopic tubes and channels of this kind can be used for DNA analysis (i.e. for DNA chromatography), underneath the surface of an oxide matrix. Micro- and nanoscopic print heads could also be produced in this way.

Applications in the field of photonics or nano-optics are also conceivable. Since the oxide matrix in which the nanowires/nanostructures are embedded can be transparent (for example HSQ), ordered nanostructures at the junction can be made use of in applications.

If the transferred nanowires consist of pn-semiconductor junctions, the nanowires embedded in the oxide matrix can be used as a diode arrangement. Metal nanowires integrated into the oxide matrix can also be used as an antenna array.

The buried nanowires could also function as gate electrodes that electrostatically control the graphene layers or similar two-dimensional layers deposited on the planarized surface. In this case, buried contacted nanowires would function as control electrodes on which the graphene layer would be deposited. Subsequently, no further lithography step would be required in order to contact the control electrodes. This advantageously prevents the graphene layer from being able to become contaminated, and allows for graphene components having very high electronic mobilities (for example for rapid transistor applications).

Since the oxide matrix protects the nanowires, hollow nanowires, i.e. nanotubes, can also be transferred, and electrically contact and connect biological cells, for example, which were, for example, transferred together with the nanowires into the carrier matrix, in accordance with a method according to an embodiment of the invention.

Figure 1A:
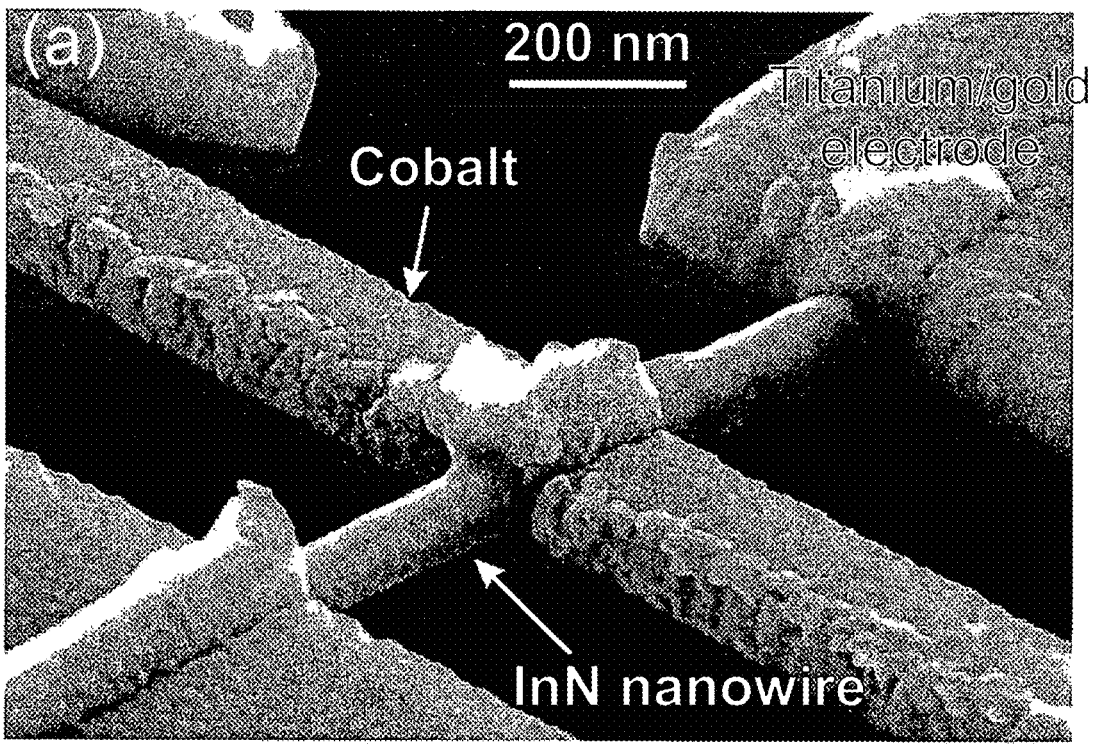
FIG. 1(a) shows a scanning electron microscope photomicrograph of conventional vapor-deposition onto nanowires of thin metal layers, there being interruptions in the electrical contacts on account of shadowing effects.

FIG. 1(a) shows the disadvantageous result, frequently occurring during conventional vapor-deposition onto nanowires of thin metal layers, that an interruption in the electrical contacts often occurs on account of shadowing effects. In particular, ferromagnetic contacts, for example made of cobalt, exhibit significant disturbances in the homogeneity of the magnetization, which is essential for many spintronics components and is shown in FIG. 1(b).

Figure 1B:
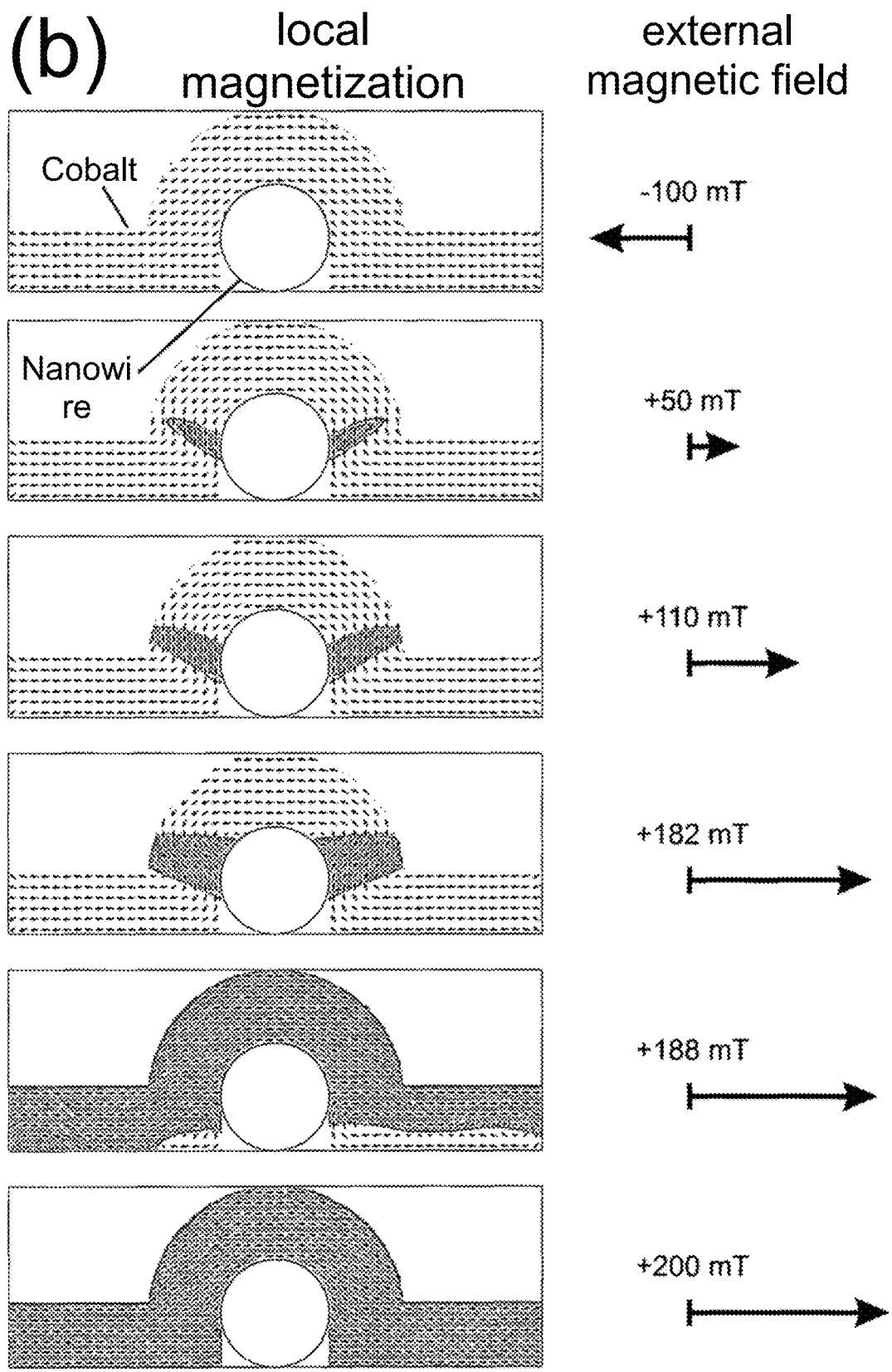
FIG. 1(b) shows calculated local magnetization in a cross section along a cobalt contact.

FIG. 1(b) shows the calculated local magnetization in a cross section along a cobalt contact which is laid around the nanowire cross section, which is circular in this case, by means of conventional deposition (without the nanowire being previously planarized). In this case, the specified external magnetic field is applied along the main axis of the cobalt strip, i.e. perpendicularly to the nanowire and in parallel with the substrate.

Arrows within the cobalt contact: local orientation of the magnetic moments shaded in gray: local magnetization oriented primarily to the right light regions: local magnetization oriented primarily to the left Right-hand arrows: orientation of the external magnetic field relative to the cobalt contact; the length of the arrows reflects the strength of the external magnetic field.

Figure 2:
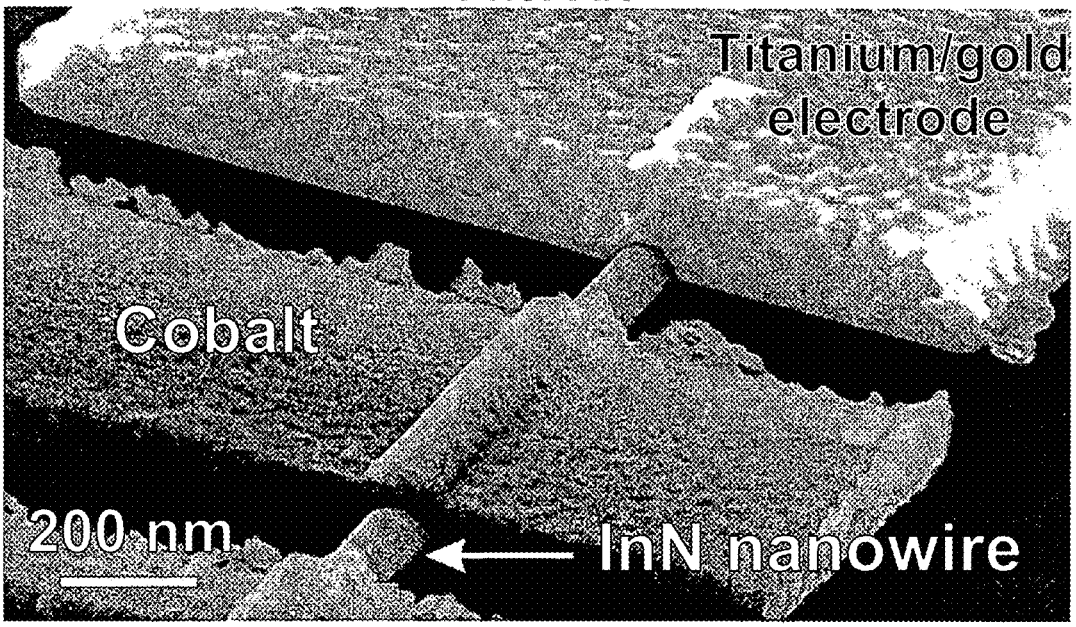
FIG. 2 shows a scanning electron microscope photomicrograph of a planarized and contacted indium nitride nanowire [2]

FIG. 2 shows a photomicrograph of an indium nitride nanowire, which has been planarized and contacted according to a method described in [2]. In the process, the nanowire was completely embedded in HSQ and subsequently exposed again by means of reactive dry etching in order that said nanowire could be electrically contacted at the surface. As a result, the cobalt metal strip has only a slight curvature, and no interruptions, as in FIG. 1(a). It is thus possible to directly switch the magnetization direction between two discrete states without domains being formed in the meantime at the point of contact with the nanowire, as in FIG. 1(b).

Figure 4:
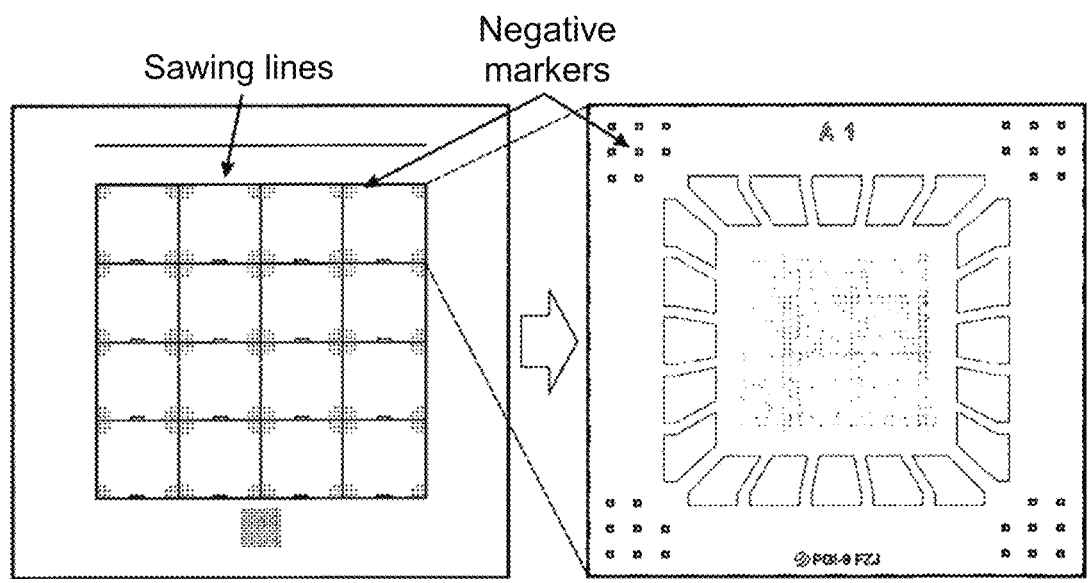
FIG. 4 shows an example layout for a conventional target substrate.

FIGS. 3 and 4 show designs, by way of example, for an initial substrate (FIG. 3) and for a target substrate (FIG. 4). The regions comprising the HSQ tiles, the position markers and the markers for the electron-beam lithography (negative markers in this case) are shown.

Figure 5A:
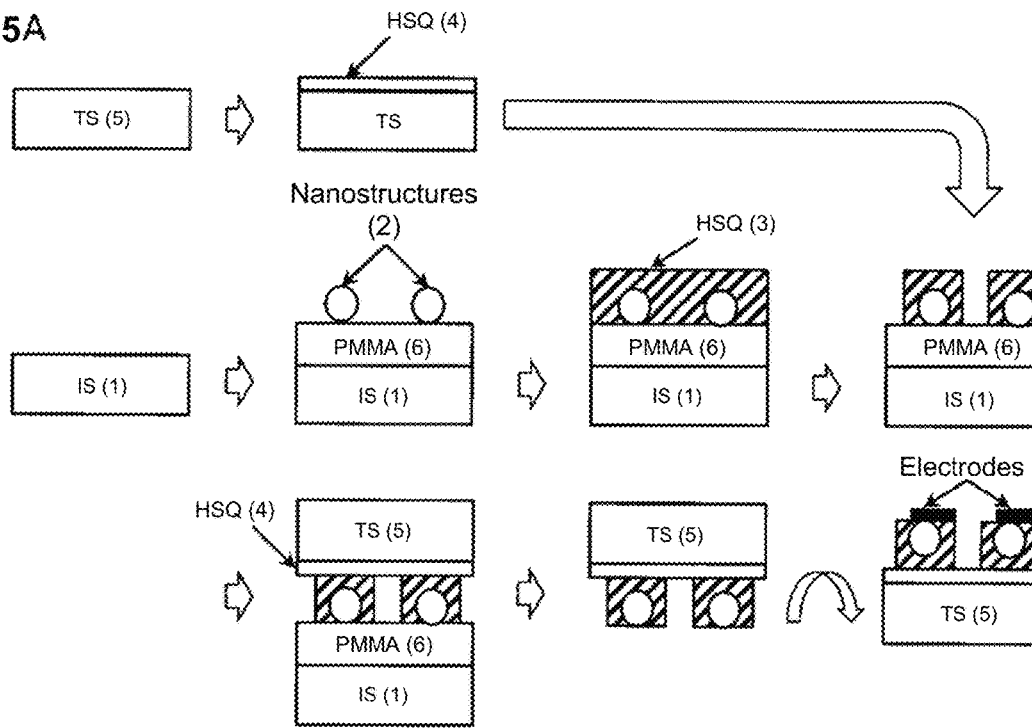
FIG. 5(a) is a schematic view of a method according to an embodiment of the invention.

FIG. 5(a) schematically shows method steps according to an embodiment of the invention. A 2-inch silicon wafer, i.e. the initial substrate IS (1) is first cleaned using acetone, isopropanol, piranha solution (diluted with water in a ratio of 1:1) and 1-percent hydrofluoric acid. Negative markers for the electron-beam lithography are created by means of optical lithography and reactive ion etching. Structures are defined by means of electron-beam lithography and subsequently transferred into the wafer by means of reactive ion etching, which structures define regions in which nanostructures/nanowires are later intended to be deposited (see FIG. 3). Subsequently, the wafer is coated with PMMA 649.04 (PMMA (6)). A spin-on speed of 6000 rpm results in a layer thickness of 120 nm.

The wafer is subsequently baked for at least 10 minutes at 180° C. in order that the resist does not further degas solvent in subsequent steps.

In a further step, nanowires (nanostructures (2)) are mechanically transferred onto the PMMA layer.

For this purpose, the initial substrate can be brought into contact with the growth substrate for example, on which growth substrate the nanostructures are epitaxially created. Alternatively, nanostructures can also be applied to the initial substrate in solution, for example in isopropanol. The solvent subsequently evaporates, whereas the nanostructures remain there. The solvent used for this purpose should be selected such that the soluble resist layer (6) is not corroded, which layer is in fact intended to later be dissolved in another solvent. Deliberate transfer using micromanipulators, or similar methods, are also possible. In the present case, the transfer is carried out mechanically using a clean room cloth. The transferred nanowires are shown, by way of example, having circular cross sections in FIG. 5.

Subsequently, the spin-on glass or the flowable oxide (HSQ (3)) is applied using a spin coater, which glass or oxide completely encloses the nanowires.

FIG. 5 additionally shows structures that were inscribed into the HSQ by means of electron-beam lithography. Regions of this kind inscribed by an electron beam change stoichiometrically, and therefore an oxide matrix is produced, in which the nanowires or nanostructures are embedded. The converted HSQ can advantageously be selectively developed (using the developer MF® CD-26), without the PMMA being corroded. By means of reactive ion etching, the selectively developed regions can be transferred into the PMMA using an oxygen plasma. A procedure of this kind allows for improved degassing during wafer bonding, and improved removal, since the solvent can more easily penetrate between the connected wafers.

The remaining PMMA tiles below the HSQ tiles, which PMMA tiles, together with said HSQ tiles, enclose the nanostructures at the junction, were also exposed by the electron beam while the HSQ layer was structured by means of electron-beam lithography. Since this process breaks the methyl methacrylate chains of the PMMA (PMMA is a positive resist), said regions may be less susceptible to disadvantageously hardening during the wafer bonding, and can also be more easily dissolved using a solvent.

The initial substrate is then connected by means of wafer bonding to the target substrate, which was previously likewise coated with HSQ. For this purpose, a second pre-cleaned 2-inch wafer, as the target substrate (TS (5)), is structured with negative markers for the electron-beam lithography (see FIG. 4) in order to allow the further processing following the planarization process, i.e. the actual electrical contacting. Said wafer is likewise coated with resist (HSQ (4)), briefly baked, in order to evaporate the solvent, and connected upside down to the initial substrate in an imprint process. Advantageously, for example the same facilities can be used for the wafer bonding as are used for the nanoimprinting. Subsequently, the two wafers (IS (1) and TS (5)) can be separated from one another in acetone, the PMMA layer (PMMA (6)) below the nanowires (2) being dissolved in the process.

Finally, the now planarized nanowires can be electrically contacted by means of electrodes being defined by electron-beam lithography, which electrodes are subsequently metallized.

Figure 5B:
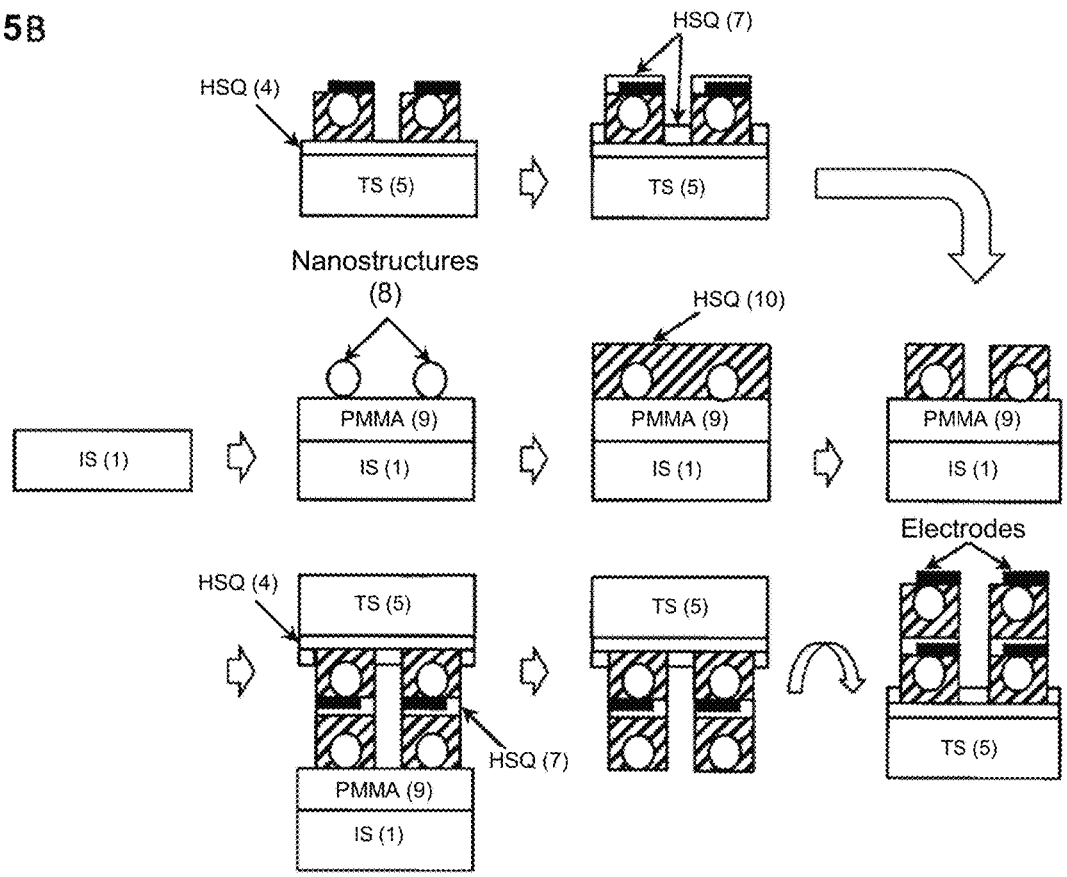
FIG. 5(b) is a schematic view of a method according to an embodiment of the invention.

Further optional method steps are shown in FIG. 5(b). In this case, the previously created target substrate comprising the nanostructures (2) embedded in the HSQ (3) layer and the electrodes arranged thereon are coated again ((HSQ (7)).

Similarly to the method steps shown in FIG. 5(a), a further initial substrate (IS (1)) is coated with PMMA (PMMA (9)) and further nanostructures (8) applied thereon. Said structures are entirely enclosed by a further spin-on glass or a flowable oxide (HSQ (10)), and said layer is optionally structured by means of electron-beam lithography. The two substrates created in this way are connected by means of wafer bonding, and the initial substrate is subsequently removed as in point A.

The method steps in FIG. 5(b) can be repeated as desired, so as to obtain layers comprising embedded nanostructures which can each be electrically contacted. In this case, the alignment of the nanostructures can be different in each plane.

Figure 6:
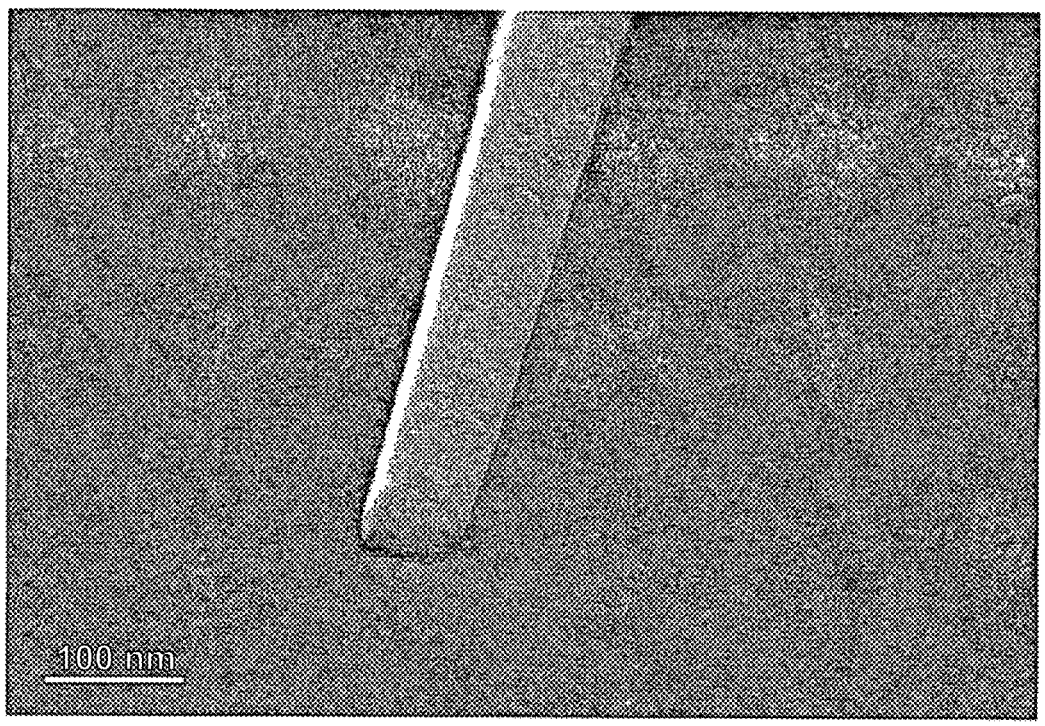
FIG. 6 shows a scanning electron microscope photomicrograph of an indium nitride nanowire after being deposited on a polymethyl methacrylate (PMMA) resist.

FIG. 6 shows the scanning electron microscope photomicrograph of an indium nitride nanowire on a PMMA resist layer. In this case, the nanowire was transferred to the resist layer using a clean room cloth. It can be clearly seen that the nanowire has very easily sunk into the PMMA layer.

Figure 7:
FIG. 7 shows an optical photomicrograph of tile-like HSQ structures, selectively developed according to an embodiment of the invention, on the PMMA layer having a typical edge length of 1.44 mm prior to wafer bonding.
Figure 8:
FIG. 8 shows an optical photomicrograph of an HSQ tile that has been transferred from an initial substrate to a target substrate.

Additionally, FIG. 8 shows an HSQ tile that has nanowires embedded therein and has been transferred to the target substrate. FIG. 7 shows an optical photomicrograph of the selectively developed HSQ tiles on the PMMA layer. The embedded indium nitride nanowires are not visible in the HSQ tiles in FIG. 7. The tile shown has edge lengths of 1.44 mm.

It can be seen in the optical photomicrograph in FIG. 8 that, in the bottom left-hand half of the image, the HSQ tile has been successfully transferred from the initial substrate to the target substrate. Following the removal of the initial substrate by means of dissolution of the PMMA layer, which has already taken place here, the nanowires embedded in the oxide matrix are located directly below the HSQ surface. The top right-hand half of the image shows previously etched negative markers for the subsequent electron-beam lithography. In this case, the HSQ layers applied advantageously do not hinder the subsequent electron-beam lithography steps.

Following the repeated cleaning, the initial substrate can advantageously be used for further process steps in order to transfer further oxide layers comprising nanostructures/nanowires embedded therein.

Figure 9:
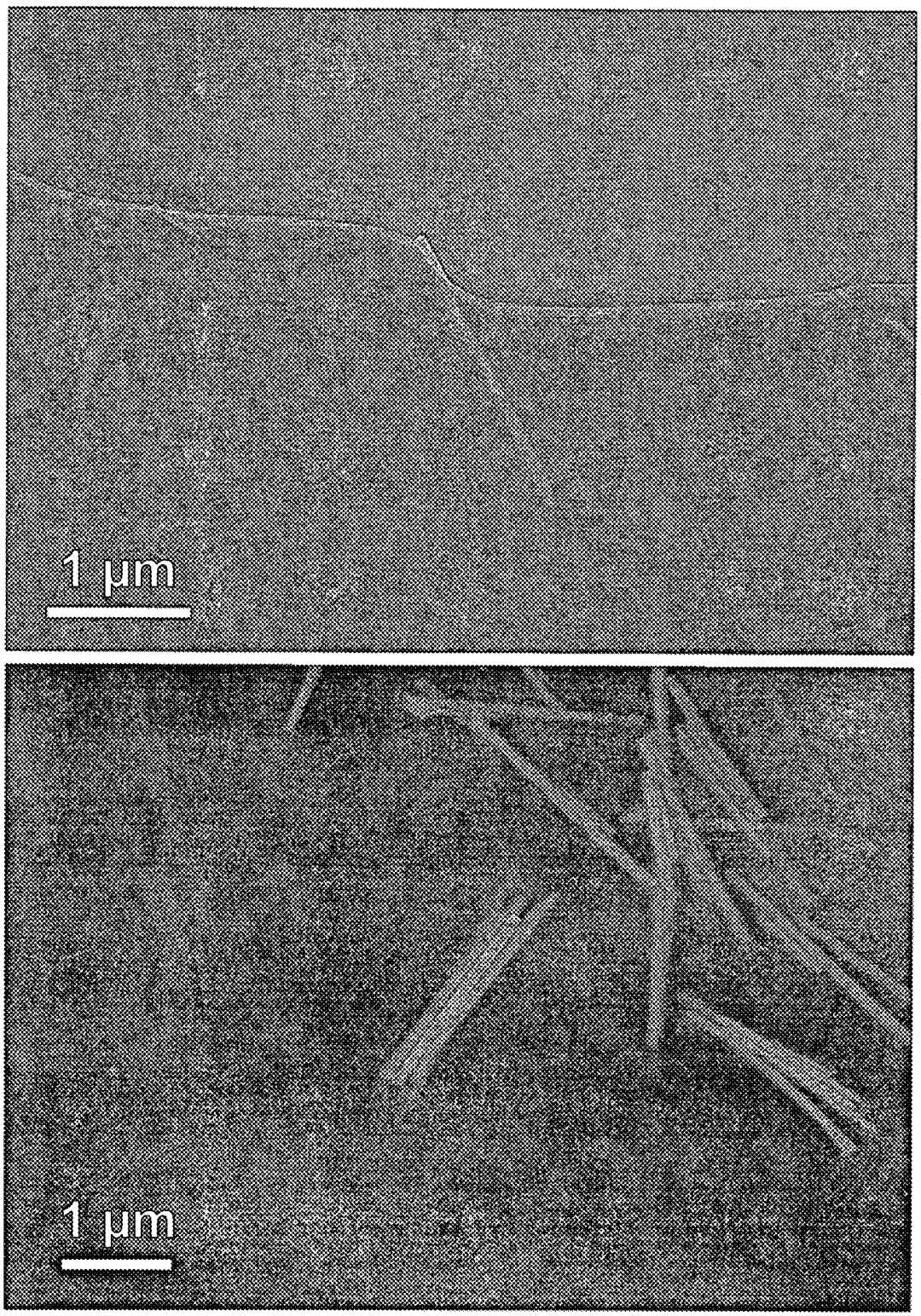
FIG. 9 shows examples of nanowires successfully transferred to a target substrate, which wires are embedded in an oxide matrix.

FIG. 9 shows scanning electron microscope photomicrographs which in each case show nanowires (light) embedded in an oxide matrix (dark gray), which nanowires were previously successfully transferred from an initial substrate to a target substrate using a method according to embodiments of the invention.

Figure 10:
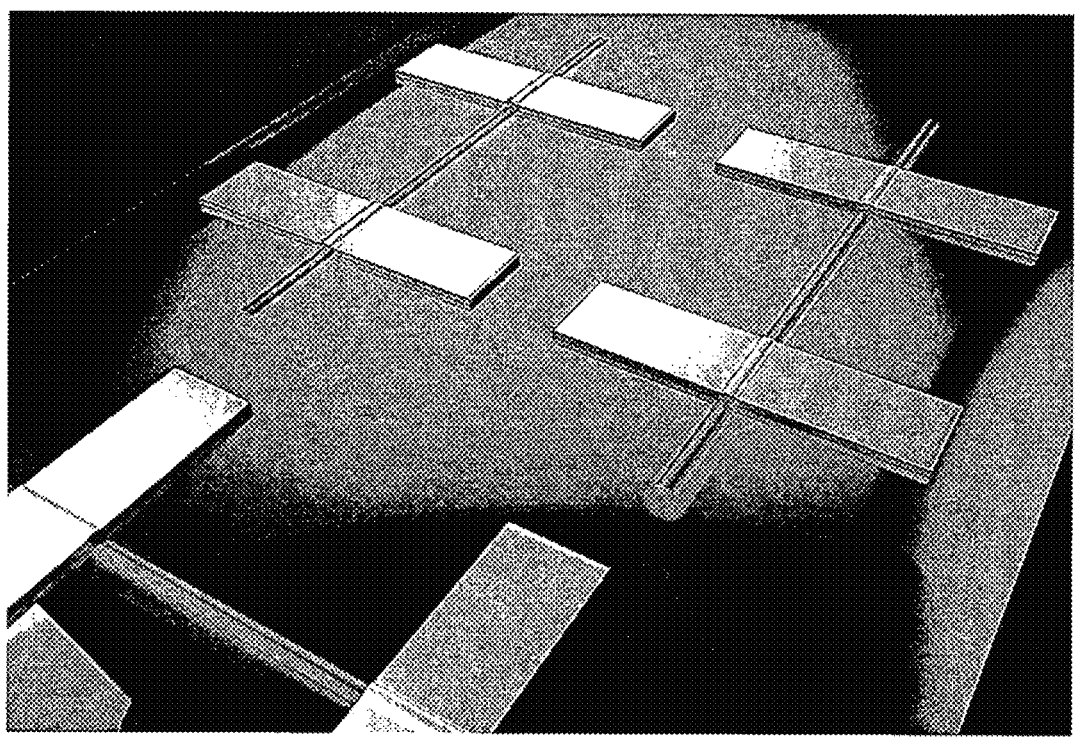
FIG. 10 illustrates advantages of a method according to an embodiment of the invention for planarizing nanostructures of varying sizes.
Figure 11:
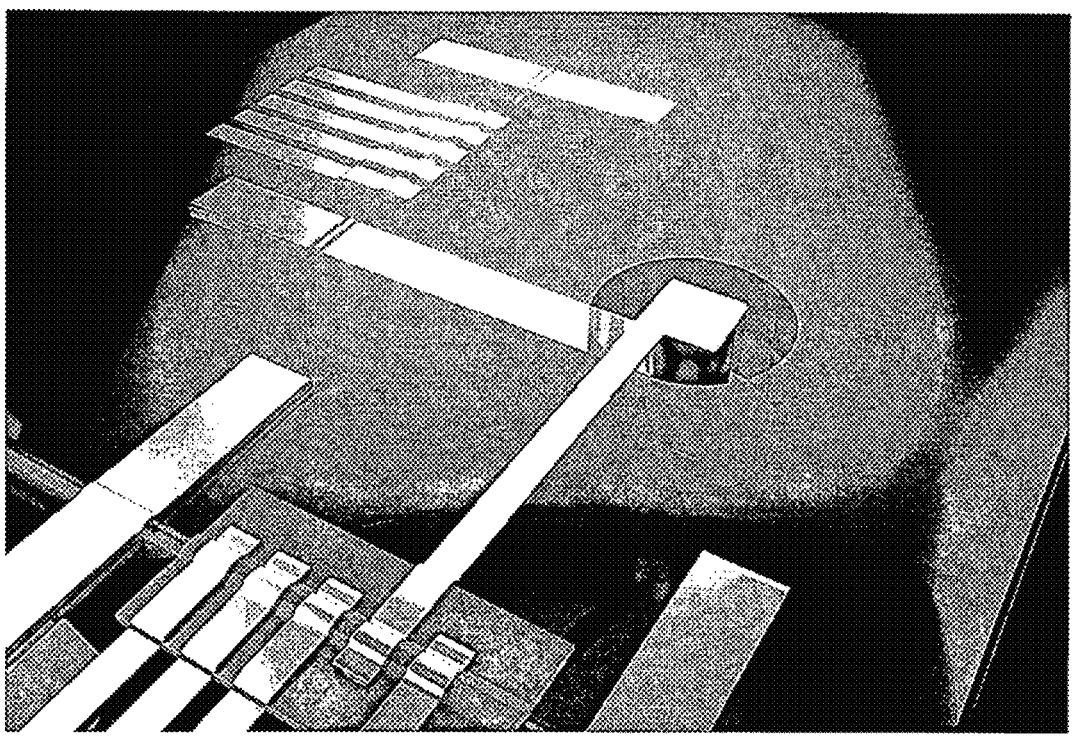
FIG. 11 illustrates advantages of a method according to an embodiment of the invention for vertically integrating nanostructures using feedthroughs.

FIGS. 10 and 11 illustrate how nanostructures can be electrically contacted following planarization according to an embodiment of the invention.

FIG. 10 clarifies the aspect of the different sizes of the embedded nanostructures. Optimal planarization occurs for all the nanostructures, regardless of the size, and therefore the function of electrical contacts and in particular magnetic electrodes is not impaired by shadowing effects.

According to FIG. 11, a method according to an embodiment of the invention advantageously allows vertical integration using feedthroughs. In the case of coupled nanowire transistor components, the transfer of the nanostructures embedded in the oxide matrix can be iteratively repeated. In this vertical integration, feedthroughs, known as vias, can be taken into account during the lithographic structuring of the HSQ layers, and thus automatically created at the desired point. Multilayer structures of nanowire networks can thus be iteratively constructed, layer-by-layer. Optionally, selective etching steps can or must (depending on the specific embodiment of the invention) be carried out between two layers, using a resist mask, in order to guide vias through the layer.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

CITED REFERENCES

[1] Zimmler et al., Nano Lett. 8, 1695, 2008
[2] Heedt et al., Nano Lett. 12, 4437, 2012
[3] Cui et al., Appl. Phys. Express 7, 085001, 2014
[4] Chung et al., IEEE Electron Device Lett. 30, 2, 2009
[5] Chung et al., IEEE Electron Device Lett. 30, 10, 2009
[6] Sheng et al., Nanotechnology 24, 0252014, 2013
[7] Flöhr et al., Rev. Sci. Instrum. 82, 113705, 2011
[8] Ferry, Science 319, 579-580, 2008

The invention claimed is:

1. A method for producing a planar free surface comprising embedded, contactable nanostructures, the method comprising:
    arranging at least one nanostructure on a surface of an initial substrate;
    applying a first layer to the surface of the initial substrate, wherein the first layer embeds the at least one nanostructure;
    applying a target substrate to the first layer; and
    separating the initial substrate from the first layer such that the at least one nanostructure embedded in the first layer has a planar free surface;
    wherein an additional layer is applied to the surface of the initial substrate before the at least one nanostructure is applied to the initial substrate,
    wherein the first layer is selectively developed by lithography and structured before the target substrate is applied to the first layer, and
    wherein the initial substrate is separated from the first layer using a solvent.

2. The method according to claim 1, wherein the at least one nanostructure comprises single-element semiconductors of the fourth main chemical group, compound semiconductors of the third and fifth main chemical groups, or compound semiconductors of the second and sixth main chemical groups.

3. The method according to claim 1, wherein the target substrate is applied to the first layer via a second layer.

4. The method according to claim 3, wherein the second layer comprises hydrogen silsesquioxane (HSQ).

5. The method according to claim 1, wherein the additional layer comprises a material that is soluble in the solvent.

6. The method according to claim 1, wherein the additional layer comprises polymethyl methacrylate (PMMA), a polymer of methyl methacrylate and methacrylic acid (PMMA/MA copolymer), or an optical photoresist.

7. The method according to claim 1, wherein the additional layer is applied to the surface of the initial substrate in a plurality of steps.

8. The method according to claim 1, wherein the additional layer is heat-treated before the at least one nanostructure is arranged on the surface of the initial substrate.

9. The method according to claim 1, wherein the first layer comprises a spin-on glass or a flowable oxide.

10. The method according to claim 9, wherein the first layer comprises hydrogen silsesquioxane (HSQ).

11. The method according to claim 1, wherein the initial substrate is removed from the first layer using a solvent comprising acetone, or using cyclopentanone or dimethyl sulfoxide.

12. The method according to claim 1, wherein the at least one nanostructure is epitaxially created.

13. The method according to claim 1, wherein the at least one nanostructure is arranged on the initial substrate by a dispersion, comprising the at least one nanostructure, or using a micromanipulator.

14. The method according to claim 1, wherein a nanowire or a network of connected nanowires is arranged as the at least one nanostructure.

15. A method for producing a planar free surface comprising embedded, contactable nanostructures, the method comprising:
    arranging at least one nanostructure on a surface of an initial substrate;
    applying a first layer to the surface of the initial substrate, wherein the first layer embeds the at least one nanostructure;
    applying a target substrate to the first layer; and
    separating the initial substrate from the first layer such that the at least one nanostructure embedded in the first layer has a planar free surface;
    wherein an additional layer is applied to the surface of the initial substrate before the at least one nanostructure is applied to the initial substrate, and
    wherein the initial substrate is separated from the first layer using a solvent,
    wherein the applied target substrate including the first layer and the at least one nanostructure embedded therein is subsequently used as a second target substrate such that a system of a plurality of layers that comprise embedded nanostructures and are arranged on top of one another is created, wherein the embedded nanostructures are configured to be connected by means of vertical feedthroughs.

16. A method for producing a planar free surface comprising embedded, contactable nanostructures, the method comprising:
    arranging at least one nanostructure on a surface of an initial substrate;
    applying a first layer to the surface of the initial substrate, wherein the first layer embeds the at least one nanostructure;
    applying a target substrate to the first layer; and
    separating the initial substrate from the first layer such that the at least one nanostructure embedded in the first layer has a planar free surface;
    wherein an additional layer is applied to the surface of the initial substrate before the at least one nanostructure is applied to the initial substrate,
    wherein the at least one nanostructure is applied to the initial substrate oriented in a planar manner on a plane formed by the surface of the initial substrate, wherein the initial substrate is separated from the first layer using a solvent, wherein the at least one nanostructure has a cross-section that is defined by a plane extending perpendicular to the plane formed by the surface of the initial substrate, and wherein the cross-section of the at least one nanostructure is circular.

17. The method according to claim 16, wherein the first layer forms a planar surface that extends parallel to the plane formed by the surface of the initial substrate, and wherein the at least one nanostructure is embedded in the first layer such that the planar surface formed by the first layer is opposite the planar free surface of the at least one nanostructure.

18. The method according to claim 17, wherein the at least one nanostructure is separated from the target substrate by the first layer when the target substrate is applied to the first layer.

\* \* \* \* \*